US 8,883,527 B2

(12) United States Patent
Wu

(10) Patent No.: US 8,883,527 B2
(45) Date of Patent: Nov. 11, 2014

(54) ORGANIC LIGHT-EMITTING DIODE DISPLAY PANEL AND MANUFACTURING METHOD FOR THE SAME

(71) Applicant: Tai-Pi Wu, Guangdong (CN)

(72) Inventor: Tai-Pi Wu, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 121 days.

(21) Appl. No.: 13/701,813

(22) PCT Filed: Oct. 12, 2012

(86) PCT No.: PCT/CN2012/082835
§ 371 (c)(1),
(2), (4) Date: Dec. 3, 2012

(87) PCT Pub. No.: WO2014/036778
PCT Pub. Date: Mar. 13, 2014

(65) Prior Publication Data
US 2014/0061596 A1    Mar. 6, 2014

(30) Foreign Application Priority Data
Sep. 6, 2012  (CN) .......................... 2012 1 0327227

(51) Int. Cl.
H01L 21/00    (2006.01)
H01L 27/32    (2006.01)
H01L 33/00    (2010.01)

(52) U.S. Cl.
CPC ........ H01L 27/3258 (2013.01); H01L 33/0095 (2013.01)
USPC ............................................. 438/26; 438/40

(58) Field of Classification Search
CPC ......................... H01L 27/3258; H01L 33/0095
USPC .......................................................... 438/26
See application file for complete search history.

(56) References Cited

U.S. PATENT DOCUMENTS

| | | | |
|---|---|---|---|
| 6,922,015 B2* | 7/2005 | Park et al. ...................... 313/506 |
| 7,834,550 B2* | 11/2010 | Lee et al. ....................... 313/512 |
| 8,016,632 B2* | 9/2011 | Kwon et al. .................... 445/25 |
| 8,188,509 B2* | 5/2012 | Lee ................................ 257/100 |
| 8,258,696 B2* | 9/2012 | Oh et al. ........................ 313/512 |
| 8,330,339 B2* | 12/2012 | Oh et al. ........................ 313/113 |
| 8,569,749 B2* | 10/2013 | Kim ................................ 257/40 |
| 8,721,381 B2* | 5/2014 | Oh et al. ........................ 445/25 |
| 2003/0122476 A1* | 7/2003 | Wang et al. ................... 313/493 |
| 2003/0137630 A1* | 7/2003 | Niiya ............................. 349/153 |
| 2003/0201712 A1* | 10/2003 | Park et al. ..................... 313/504 |
| 2003/0218422 A1* | 11/2003 | Park et al. ..................... 313/512 |
| 2004/0069017 A1* | 4/2004 | Li et al. ......................... 65/43 |
| 2004/0150319 A1* | 8/2004 | Tomimatsu et al. .......... 313/495 |
| 2007/0096631 A1* | 5/2007 | Sung et al. .................... 313/498 |
| 2007/0170605 A1* | 7/2007 | Lee et al. ....................... 264/1.1 |

(Continued)

Primary Examiner — Yu-Hsi D Sun
Assistant Examiner — Grant Withers
(74) Attorney, Agent, or Firm — Kirton McConkie; Evan R. Witt

(57) ABSTRACT

The present invention discloses an OLED display panel which includes a first TFT array substrate, a first cover and a structural stiffening glue. A first frit and a second frit of the first cover have the structural stiffening glue provided at an outer side thereof, and the structural stiffening glue is in contact with the first TFT array substrate and the first cover. The present invention further discloses a method for manufacturing the OLED display panel. The present invention enables more solid and stable for a structure of the OLED display panel.

11 Claims, 4 Drawing Sheets

(56) References Cited

U.S. PATENT DOCUMENTS

| | | | |
|---|---|---|---|
| 2007/0171637 A1* | 7/2007 | Choi | 362/227 |
| 2007/0172971 A1* | 7/2007 | Boroson | 438/26 |
| 2007/0173167 A1* | 7/2007 | Choi | 445/25 |
| 2007/0177069 A1* | 8/2007 | Lee | 349/56 |
| 2008/0143247 A1* | 6/2008 | Kim et al. | 313/504 |
| 2009/0039760 A1* | 2/2009 | Kwon et al. | 313/498 |
| 2009/0039780 A1* | 2/2009 | Kim et al. | 313/512 |
| 2009/0058292 A1* | 3/2009 | Koo et al. | 313/512 |
| 2010/0013071 A1* | 1/2010 | Chol et al. | 257/682 |
| 2010/0091233 A1* | 4/2010 | Yamagishi | 349/153 |
| 2010/0148157 A1* | 6/2010 | Song et al. | 257/40 |
| 2010/0244057 A1* | 9/2010 | Ryu et al. | 257/88 |
| 2012/0068169 A1* | 3/2012 | Hirase et al. | 257/40 |
| 2012/0080671 A1* | 4/2012 | Niboshi et al. | 257/40 |
| 2012/0112212 A1* | 5/2012 | Kim | 257/88 |
| 2013/0048967 A1* | 2/2013 | Nishido et al. | 257/40 |
| 2013/0089933 A1* | 4/2013 | Suga | 438/4 |
| 2013/0134570 A1* | 5/2013 | Nishido | 257/680 |
| 2014/0110685 A1* | 4/2014 | Hong et al. | 257/40 |
| 2014/0110697 A1* | 4/2014 | Choi et al. | 257/40 |

* cited by examiner

ORGANIC LIGHT-EMITTING DIODE DISPLAY PANEL AND MANUFACTURING METHOD FOR THE SAME

BACKGROUND OF THE INVENTION

1. Field of the Invention

The present invention relates to a field of organic light-emitting diode (OLED) display technology, and more particularly, to an OLED display panel and a manufacturing method for the same.

2. Description of the Prior Art

In a process of manufacturing a traditional OLED display panel, frits 1031, 1032, 1033, and 1034 are disposed between a thin film transistor (TFT) array substrate 101 and a cover 102. The frits are first disposed on edges of sub-substrates (including a first TFT array substrate 1011 and a second TFT array substrate 1012) of the TFT array substrate 101, respectively. Then, the TFT array substrate 101 is correspondingly arranged with the cover 102 (including a first cover 1021 and a second cover 1022). Final, a position between two sub-substrates of a combination of the TFT array substrate 101 and the cover 102 is cut.

In the process of manufacturing the traditional OLED display panel, since the frits are disposed on the edges of two adjacent sub-substrates of the TFT array substrate 101 (as shown in FIGS. 1 and 2), a spacing is existed between the frits 1032 and 1033 of the two adjacent sub-substrates, and a negative pressure state has existed between the TFT array substrate 101 and the cover 102. Therefore, after correspondingly arranging the TFT array substrate 101 onto the cover 102, warpage of the cover 102 or the TFT array substrate 101 will occur, so that the frits disposed between the TFT array substrate 101 and the cover 102 have become a supporting point of the warpage of the cover 102 or the TFT array substrate 101.

Further, after cutting the combination of the TFT array substrate 101 and the cover 102, the warpage of the TFT array substrate 101 or the cover 102, so that the TFT array substrate 101 is not tightly engaged with the cover 102. Therefore, a displacement of any one of the TFT array substrate 101 and the cover 102 will easily occur, so that the combination of the TFT array substrate 101 and the cover 102 has less structural strength. Specifically, the frits are sandwiched between the TFT array substrate 101 and the cover 102. Thus, when a center portion of the TFT array substrate 101 or the cover 102 is pressed, the frits positioned on edges of the TFT array substrate 101 and the cover 102 are often acted as the supporting point, and the edges of the TFT array substrate 101 or the cover 102 will has the warpage around the supporting point, so that a structure of an OLED display panel has not stable, thereby affecting the quality of a finished product of the OLED display panel.

Therefore, there is a need to provide a new technical scheme, so as to overcome the above-mentioned disadvantages.

SUMMARY OF THE INVENTION

An object of the present invention is to provide a method for manufacturing an OLED display panel. The present invention is capable of slowing or preventing warpage of a TFT array substrate or a cover, thereby increasing structural strength of a combination of the TFT array substrate and the cover.

To overcome the above-mentioned disadvantages, the present invention provides a method for manufacturing the OLED display panel, such that the method includes the following steps of:

(A) providing a TFT array substrate and a cover, the TFT array substrate comprising a first TFT array substrate and a second TFT array substrate, a first connecting area being defined between the first TFT array substrate and the second TFT array substrate, a first frit, a second frit, a third frit and a fourth frit being disposed on the cover, an area between the first frit and the second frit on the cover being aligned to the first TFT array substrate, an area between the third frit and the fourth frit on the cover being aligned to the second TFT array substrate, a second connecting area being defined between the second frit and the third frit on the cover, and a position of the first connecting area being aligned to a position of the second connecting area;

(B) disposing a structural stiffening glue onto the second connecting area of the cover or the first connecting area of the TFT array substrate, and the structural stiffening glue being applied to strengthen a structure of a combination of the first TFT array substrate and the cover;

(C) combining the cover onto the TFT array substrate; and (D) cutting a predetermined position of the combination of the TFT array substrate and the cover, and the predetermined position being positioned at a position corresponding to the second connecting area, wherein the step (B) includes the following step of:

(b1) coating the structural stiffening glue onto the second connecting area of the cover or the first connecting area of the TFT array substrate, so that the structural stiffening glue being in contact with the cover and the TFT array substrate, respectively, when the cover being combined on the TFT array substrate.

In a method for manufacturing the above OLED display panel, in between the step (C) and the step (D), the method further includes the following step of:

(E) curing the structural stiffening glue.

In a method for manufacturing the above OLED display panel, the structural stiffening glue includes an ultraviolet (UV) curing glue, and the step (E) includes the following step of:

(e1) irradiating the UV curing glue by an UV light, so as to cure the UV curing glue.

In a method for manufacturing the above OLED display panel, the structural stiffening glue contains particles, and before the step (b1), further including the following steps of:

(b2) providing the UV curing glue and the particles; and (b3) mixing the particles and the UV curing glue.

In a method for manufacturing the above OLED display panel, the particle is a polyhedron or a sphere.

Another object of the present invention is to provide a method for manufacturing an OLED display panel. The present invention is capable of slowing or preventing warpage of a TFT array substrate or a cover, thereby increasing structural strength of a combination of the TFT array substrate and the cover.

To overcome the above-mentioned disadvantages, the present invention provides a method for manufacturing the OLED display panel, such that the method includes the following steps of:

(A) providing a TFT array substrate and a cover, the TFT array substrate comprising a first TFT array substrate and a second TFT array substrate, a first connecting area being defined between the first TFT array substrate and the second TFT array substrate, a first frit, a second frit, a third frit and a fourth frit being disposed on the cover, an area between the first frit and the second frit on the cover being aligned to the first TFT array substrate, an area between the third frit and the fourth frit on the cover being aligned to the second TFT array substrate, a second connecting area being defined between the second frit and the third frit on the cover, and a position of the first connecting area being aligned to a position of the second connecting area;

(B) disposing a structural stiffening glue onto the second connecting area of the cover or the first connecting area of the TFT array substrate;

(C) combining the cover onto the TFT array substrate; and (D) cutting a predetermined position of the combination of the TFT array substrate and the cover, and the predetermined position being positioned at a position corresponding to the second connecting area.

In a method for manufacturing the above OLED display panel, such that step (B) includes the following step of:

(b1) coating the structural stiffening glue onto the second connecting area of the cover or the first connecting area of the TFT array substrate, so that the structural stiffening glue being in contact with the cover and the TFT array substrate, respectively, when the cover being combined on the TFT array substrate.

In a method for manufacturing the above OLED display panel, in between the step (C) and the step (D), the method further includes the following step of:

(E) curing the structural stiffening glue.

In a method for manufacturing the above OLED display panel, the structural stiffening glue includes an ultraviolet (UV) curing glue, and the step (E) includes the following step of:

(e1) irradiating the UV curing glue by an UV light, so as to cure the UV curing glue.

In a method for manufacturing the above OLED display panel, the structural stiffening glue contains particles, and before the step (b1), further including the following steps of:

(b2) providing the UV curing glue and the particles; and (b3) mixing the particles and the UV curing glue.

In a method for manufacturing the above OLED display panel, the particle is a polyhedron or a sphere.

A further another object of the present invention is to provide an OLED display panel. The present invention is capable of slowing or preventing warpage of a TFT array substrate or a cover, thereby increasing structural strength of a combination of the TFT array substrate and the cover.

To overcome the above-mentioned disadvantages, the present invention provides the OLED display panel which includes:

a first TFT array substrate;

a first cover being disposed on the first TFT array substrate, a first frit and a second frit being disposed on the first cover, and an area between the first frit and the second frit on the first cover being aligned to the first TFT array substrate; and a structural stiffening glue being disposed at an outer side of the first frit and the second frit of the first cover, and the structural stiffening glue being in contact with the first TFT array substrate and the first cover.

In the above OLED display panel, the structural stiffening glue is a mixture of an UV curing glue and particles.

In the above OLED display panel, the particle is a polyhedron or a sphere.

In the above OLED display panel, the material of the particle is glass.

In the present invention, since the structural stiffening glue is disposed on the first connecting area of the TFT array substrate or the second connecting area of the cover, and therefore the structural stiffening glue can play a role of connection or support with regard to the TFT array substrate and the cover. Moreover, after a combination of the TFT array substrate and the cover, a space corresponding to the first connecting area or the second connecting area is partially or completely filled with the structural stiffening glue, so as to increase air pressure of the space which is in a negative pressure state, thereby slowing and perhaps even preventing the warpage of the TFT array substrate or the cover caused by the negative pressure state between the TFT array substrate and the cover.

Moreover, since the warpage of the TFT array substrate or the cover is slowed or prevented, and therefore the TFT array substrate and the cover can have more contacting area with frits (including the first frit, the second frit, the third frit and the fourth frit), that is, the TFT array substrate and the cover can more fully flatted on the frits to increase an effective area of the frits cured by a laser, so that a structure of a combination of the TFT array substrate, the cover and the frits has more solid.

Moreover, the structural stiffening glue is capable of strengthening a structure of the OLED display panel. When a center portion of the cover is pressed, the structural stiffening glue is capable of applying a pulling force at an edge of the cover to prevent the warpage of the cover, so that the structure of the OLED display panel of the present invention is more stable.

Since the structural stiffening glue contains the particles, the particles and the UV curing glue are mixed, and therefore the structural stiffening glue has more cohesive force and strength after curing, that advantages to improve a life span of the structural stiffening glue, thereby improving a life span of the OLED display panel of the present invention.

The above objectives, other objectives, features, advantages and embodiments of the present invention will be better understood from the following description being considered in connection with the accompanied drawings and in which a preferred embodiment of the invention is illustrated by way of example.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced.

Figure 1:
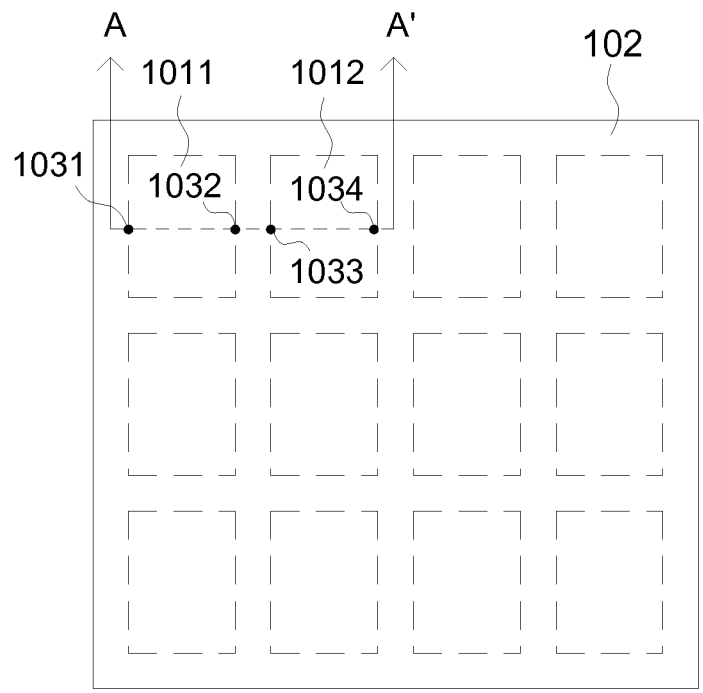
FIG. 1 is a schematic view of a traditional OLED display panel before cutting arrays.
Figure 2A:
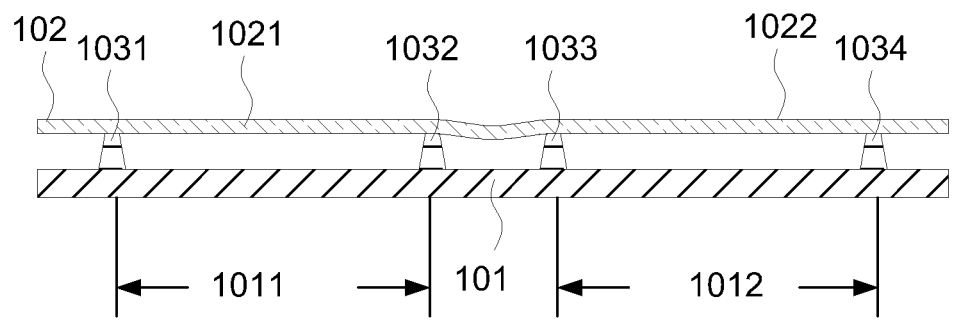
FIG. 2 is a schematic view of a cross-section A-A' of FIG. 1.
Figure 3A:
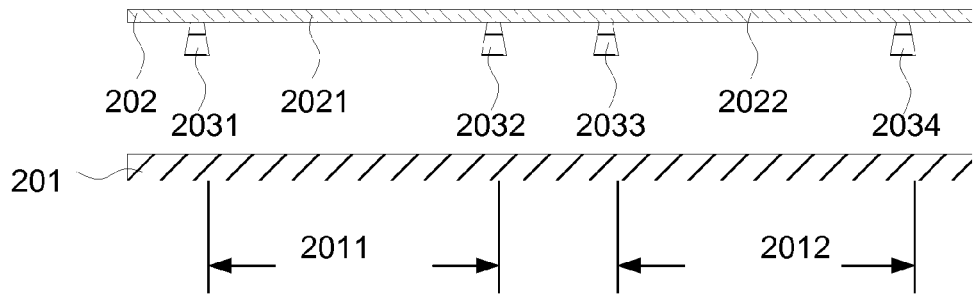
FIGS. 3A, 3B, 3C and 3D are schematic views of a method according to the present invention for manufacturing an OLED display panel.
Figure 3B:
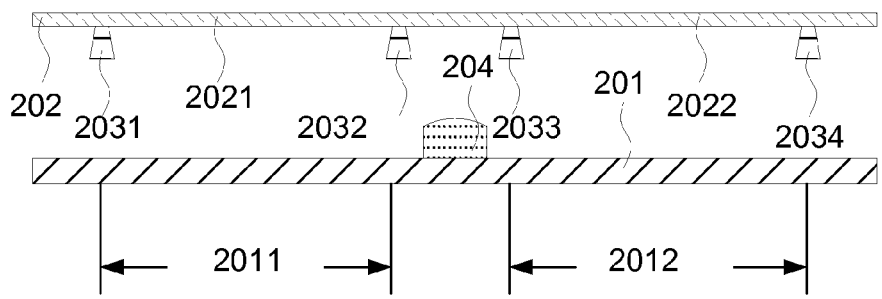
Figure 3C:
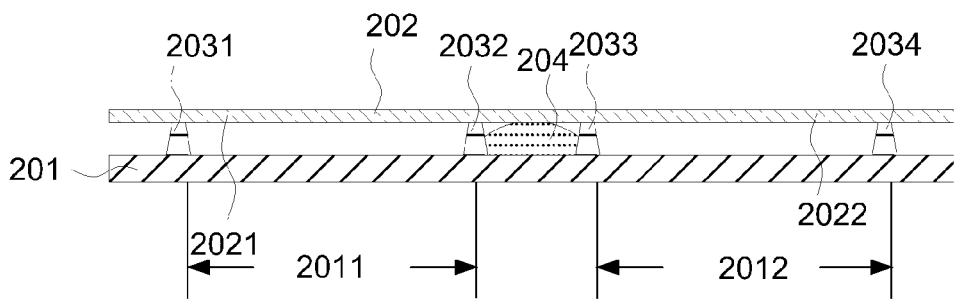
Figure 3D:
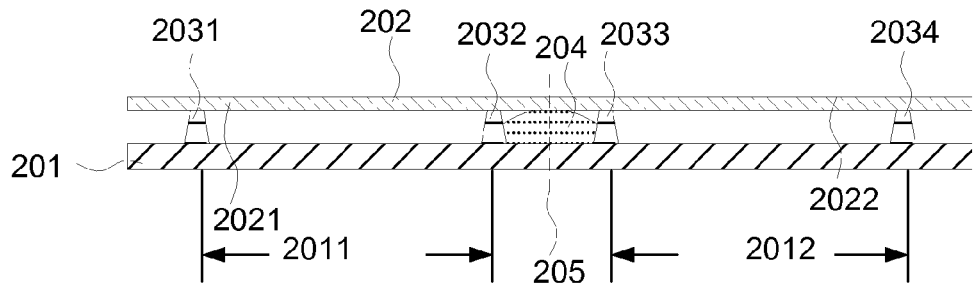
Figure 4:
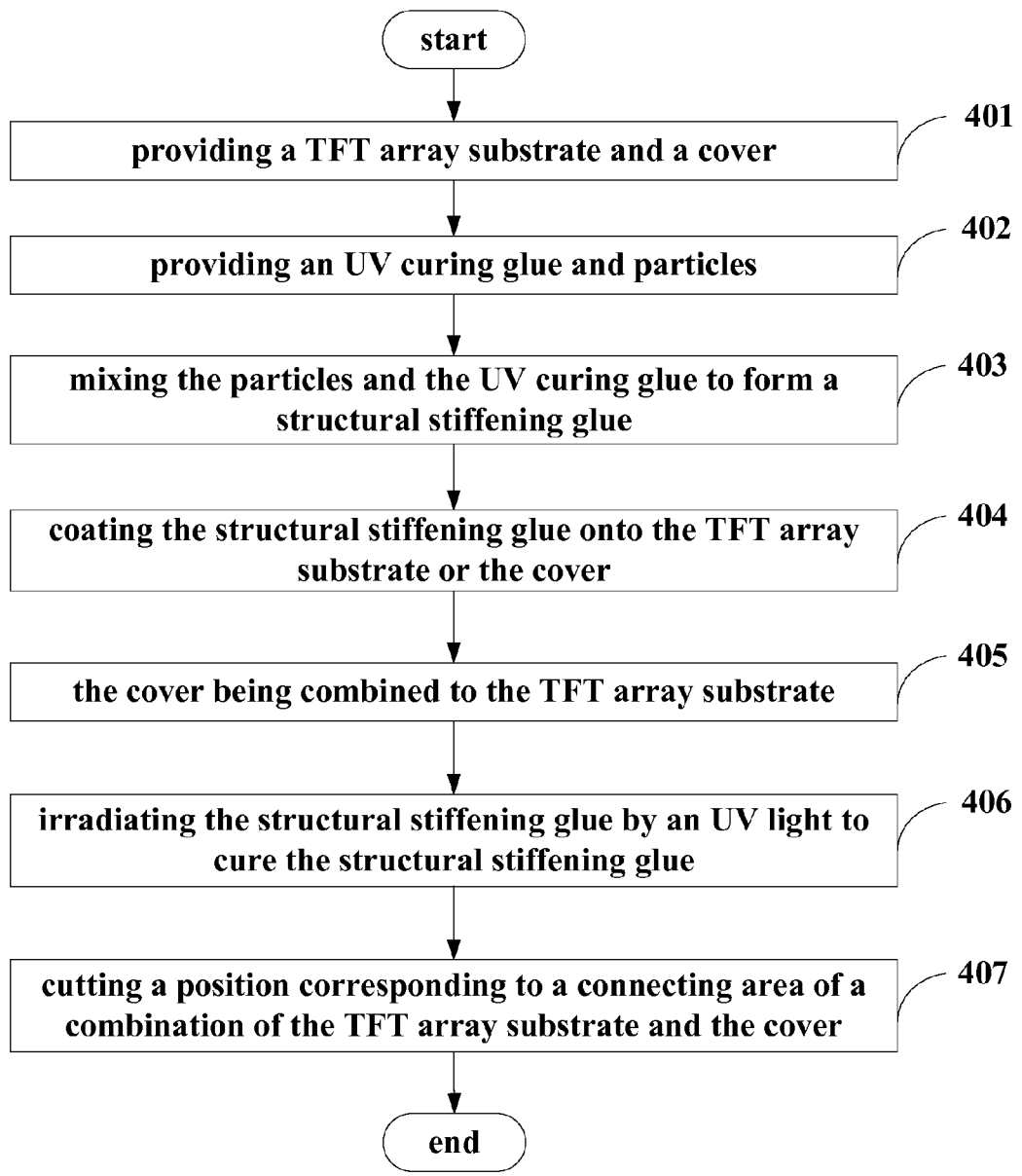
FIG. 4 is a flow chart of a method according to the present invention for manufacturing the OLED display panel.

Please refer to FIGS. 3A, 3B, 3C, 3D and 4, wherein FIGS. 3A, 3B, 3C and 3D are schematic views of a method according to the present invention for manufacturing an OLED display panel, and FIG. 4 is a flow chart of a method according to the present invention for manufacturing the OLED display panel.

In step 401, a TFT array substrate 201 and a cover 202 are provided. The TFT array substrate 201 includes a plurality of sub-TFT array substrate, such as a first TFT array substrate 2011 and a second TFT array substrate 2012. A first connecting area is defined between the first TFT array substrate 2011 and the second TFT array substrate 2012. A first frit 2031, a second frit 2032, a third frit 2033 and a fourth frit 2034 are disposed on the cover 202. An area between the first frit 2031 and the second frit 2032 on the cover 202 is aligned to the first TFT array substrate 2011. An area between the third frit 2033 and the fourth frit 2034 on the cover 202 is aligned to the second TFT array substrate 2012. A second connecting area being defined between the second frit 2032 and the third frit 2033 on the cover 202. A position of the first connecting area is aligned to a position of the second connecting area.

In step 402 to step 403, a structural stiffening glue 204 is provided. The structural stiffening glue 204 is applied to strengthen a structure of a combination of the TFT array substrate 201 and the cover 202. Specifically, in the step 402, an UV curing glue and particles are provided. The particles have less impurities to enable the structural stiffening glue 204 having more cohesive force and strength, so that the structure of the combination of the TFT array substrate 201 and the cover 202 has more solid. In the step 403, the particles and the UV curing glue are mixed to form the structural stiffening glue. Specifically, the UV curing glue and the particles are sufficiently mixed, so that the particles are uniformly distributed in the UV curing glue. The particle can be a polyhedron or a sphere. The material of the particle can be glass.

In step 404, the structural stiffening glue 204 is disposed on the second connecting area of the cover 202 or the first connecting area of the TFT array substrate 201. Specifically, the structural stiffening glue 204 is coated on the second connecting area of the cover 202 or the first connecting area of the TFT array substrate 201, and the structural stiffening glue 204 coated on the second connecting area of the cover 202 or the first connecting area of the TFT array substrate 201 have sufficient amounts of the structural stiffening glue 204, so that the structural stiffening glue 204 is in contact with the cover 202 and the TFT array substrate 201, respectively, when the cover 202 is combined on the TFT array substrate 201.

In step 405, the cover 202 is combined to the TFT array substrate 201.

In step 406, the structural stiffening glue is cured. Specifically, in step 406, the structural stiffening glue 204 is irradiated by an UV light, so that the UV curing glue within the structural stiffening glue 204 is cured.

In step 407, a predetermined position of the combination of the TFT array substrate 201 and the cover 202 is cut. The predetermined position is positioned at a position corresponding to the second connecting area. Please refers to FIG. 3, the predetermined position is a position of a straight line within FIG. 3.

In the above-mentioned method, since the structural stiffening glue 204 is disposed on the first connecting area of the TFT array substrate 201 or the second connecting area of the cover 202, and therefore the structural stiffening glue 204 can play a role of connection or support with regard to the TFT array substrate 201 and the cover 202. Moreover, after a combination of the TFT array substrate 201 and the cover 202, a space corresponding to the first connecting area or the second connecting area is partially or completely filled with the structural stiffening glue 204, so as to increase air pressure of the space which is in a negative pressure state, thereby slowing and perhaps even preventing warpage of the TFT array substrate 201 or the cover 202 caused by the negative pressure state between the TFT array substrate 201 and the cover 202.

Moreover, since the warpage of the TFT array substrate 201 or the cover 202 is slowed or prevented, and therefore the TFT array substrate 201 and the cover 202 can have more contacting area with frits (including the first frit 2031, the second frit 2032, the third frit 2033 and the fourth frit 2034), that is, the TFT array substrate 201 and the cover 202 can more fully flatted on the frits to increase an effective area of the frits cured by a laser, so that a structure of a combination of the TFT array substrate 201, the cover 202 and the frits has more solid.

Figure 5:
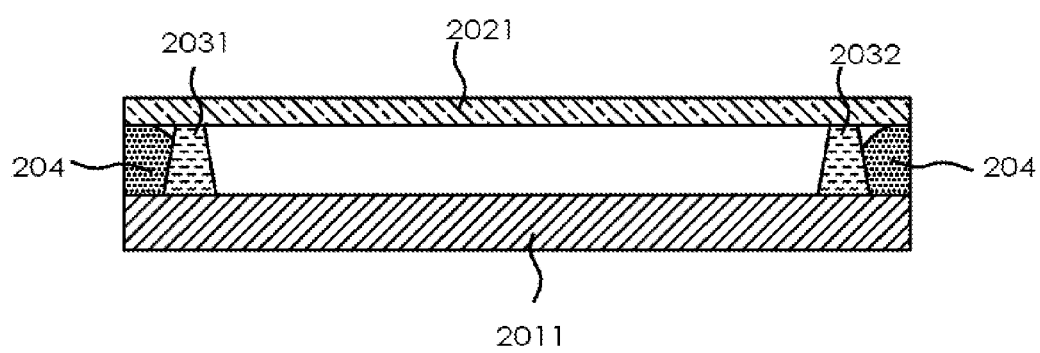
FIG. 5 is a schematic view of a structure of the OLED display panel according to the present invention.

Please refer to FIG. 5. FIG. 5 is a schematic view of a structure of the OLED display panel according to the present invention. The OLED display panel according to the present invention includes the first TFT array substrate 2011, a first cover 2021 and the structural stiffening glue 204. The first cover 2021 is disposed on the first TFT array substrate 2011, the first frit 2031 and the second frit 2032 are disposed on the first cover 2021, and the area between the first frit 2031 and the second frit 2032 on the first cover 2021 is aligned to the first TFT array substrate 2011. The structural stiffening glue 204 is disposed at an outer side of the first frit 2031 and the second frit 2032 of the first cover 2021, and the structural stiffening glue 204 coated on an edge of the outer side of the first frit 2031 and the second frit 2032 of the first cover 2021 have sufficient amounts of the structural stiffening glue 204, so that the structural stiffening glue 204 is in contact with the first TFT array substrate 2011 and the first cover 2021, respectively, when the first cover 2021 is combined on the first TFT array substrate 2011. The structural stiffening glue 204 is applied to strengthen a structure of a combination of the first TFT array substrate 2011 and the first cover 2021. The structural stiffening glue 204 is a mixture of the UV curing glue and the particles. The particles have less impurities to enable the structural stiffening glue 204 having more cohesive force and strength, so that the structure of the combination of the first TFT array substrate 2011 and the first cover 2021 has more solid. The particles are uniformly distributed in the UV curing glue. The particle can be the polyhedron or the sphere. The material of the particle can be glass.

However, since the structural stiffening glue 204 is sandwiched between the first TFT array substrate 2011 and the first cover 2021 of the OLED display panel of the present invention, the structural stiffening glue 204 is positioned at the edge of the outer side of the first frit 2031 and the second frit 2032 of the first cover 2021, and the structural stiffening glue 204 is in contact with the first TFT array substrate 2011 and the first cover 2021, respectively. Therefore, the structural stiffening glue 204 is capable of strengthening the structure of the OLED display panel. Specifically, when a center portion of the first cover 2021 is pressed, the structural stiffening glue 204 is capable of applying a pulling force at an edge of the first cover 2021 to prevent the warpage of the first cover 2021, so that the structure of the OLED display panel of the present invention is more stable.

Moreover, since the warpage of the first TFT array substrate 2011 or the first cover 2021 is prevented, and therefore the first TFT array substrate 2011 and the first cover 2021 can have more contacting area with the frits, that is, the first TFT array substrate 2011 and the first cover 2021 can more fully flatted on the frits to increase the effective area of the frits cured by the laser, so that a structure of a combination of the first TFT array substrate 2011, the first cover 2021 and the frits has more solid.

Moreover, since the structural stiffening glue 204 contains the UV curing glue, and therefore the UV curing glue is irradiated just by the UV light to cure the UV curing glue in a process for manufacturing the OLED display panel of the present invention, that is, the structural stiffening glue 204 is cured, thereby advantages to reduce manufacturing time of the OLED display panel of the present invention.

Since the structural stiffening glue 204 contains the particles, the particles and the UV curing glue are mixed, and therefore the structural stiffening glue 204 has more cohesive force and strength after curing, that advantages to improve a life span of the structural stiffening glue 204, thereby improving a life span of the OLED display panel of the present invention.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing an organic light-emitting diode (OLED) display panel, the method comprising steps of:
   (A) providing a thin film transistor (TFT) array substrate and a cover, the TFT array substrate comprising a first TFT array substrate and a second TFT array substrate, a first connecting area being defined between the first TFT array substrate and the second TFT array substrate, a first frit, a second frit, a third frit and a fourth frit being disposed on the cover, an area between the first frit and the second frit on the cover being aligned to the first TFT array substrate, an area between the third frit and the fourth frit on the cover being aligned to the second TFT array substrate, a second connecting area being defined between the second frit and the third frit on the cover, and a position of the first connecting area being aligned to a position of the second connecting area;
   (B) disposing a structural stiffening glue onto the second connecting area of the cover or the first connecting area of the TFT array substrate, and the structural stiffening glue being applied to strengthen a structure of a combination of the first TFT array substrate and the cover;
   (C) combining the cover onto the TFT array substrate; and
   (D) cutting a predetermined position of the combination of the TFT array substrate and the cover, and the predetermined position being positioned at a position corresponding to the second connecting area,
   wherein the step (B) includes the following step of:
   (b1) coating the structural stiffening glue onto the second connecting area of the cover or the first connecting area of the TFT array substrate, so that the structural stiffening glue is in contact with the cover and the TFT array substrate, respectively, when the cover is combined onto the TFT array substrate.

2. The method for manufacturing an OLED display panel of claim 1, wherein in between the step (C) and the step (D), the method further comprises the following step of:
   (E) curing the structural stiffening glue.

3. The method for manufacturing an OLED display panel of claim 2, wherein the structural stiffening glue comprises an ultraviolet (UV) curing glue, and the step (E) comprises the following step of:
   (e1) irradiating the UV curing glue by an UV light, so as to cure the UV curing glue.

4. The method for manufacturing an OLED display panel of claim 3, wherein the structural stiffening glue contains particles, and before the step (b1), further comprising the following steps of:
   (b2) providing the UV curing glue and the particles; and
   (b3) mixing the particles and the UV curing glue.

5. The method for manufacturing an OLED display panel of claim 4, wherein the particle is a polyhedron or a sphere.

6. A method for manufacturing an organic light-emitting diode (OLED) display panel, the method comprising steps of:
   (A) providing a thin film transistor (TFT) array substrate and a cover, the TFT array substrate comprising a first TFT array substrate and a second TFT array substrate, a first connecting area being defined between the first TFT array substrate and the second TFT array substrate, a first frit, a second frit, a third frit and a fourth frit being disposed on the cover, an area between the first frit and the second frit on the cover being aligned to the first TFT array substrate, an area between the third frit and the fourth frit on the cover being aligned to the second TFT array substrate, a second connecting area being defined between the second frit and the third frit on the cover, and a position of the first connecting area being aligned to a position of the second connecting area;
   (B) disposing a structural stiffening glue onto the second connecting area of the cover or the first connecting area of the TFT array substrate;
   (C) combining the cover onto the TFT array substrate; and
   (D) cutting a predetermined position of the combination of the TFT array substrate and the cover, and the predetermined position being positioned at a position corresponding to the second connecting area.

7. The method for manufacturing an OLED display panel of claim 6, wherein the step (B) comprises the following step of:
   (b1) coating the structural stiffening glue onto the second connecting area of the cover or the first connecting area of the TFT array substrate, so that the structural stiffening glue is in contact with the cover and the TFT array substrate, respectively, when the cover is combined onto the TFT array substrate.

8. The method for manufacturing an OLED display panel of claim 7, wherein in between the step (C) and the step (D), the method further comprises the following step of:
   (E) curing the structural stiffening glue.

9. The method for manufacturing an OLED display panel of claim 8, wherein the structural stiffening glue comprises an ultraviolet (UV) curing glue, and the step (E) comprises the following step of:
   (e1) irradiating the UV curing glue by an UV light, so as to cure the UV curing glue.

10. The method for manufacturing an OLED display panel of claim 9, wherein the structural stiffening glue contains particles, and before the step (b1), further comprising the following steps of:
    (b2) providing the UV curing glue and the particles; and
    (b3) mixing the particles and the UV curing glue.

11. The method for manufacturing an OLED display panel of claim 10, wherein the particle is a polyhedron or a sphere.

* * * * *